United States Patent [19]
Lee et al.

[11] Patent Number: 6,066,961
[45] Date of Patent: May 23, 2000

[54] INDIVIDUALLY ACCESSIBLE MACROCELL

[75] Inventors: Ching Lee, Fremont; Yoram Cedar, Cupertino, both of Calif.

[73] Assignee: Waferscale Integration Inc., Fremont, Calif.

[21] Appl. No.: 09/095,808

[22] Filed: Jun. 10, 1998

Related U.S. Application Data

[63] Continuation-in-part of application No. 08/742,710, Nov. 1, 1996, Pat. No. 5,834,947.

[51] Int. Cl.$^7$ .................................................. H03K 19/77
[52] U.S. Cl. ................................................. 326/39; 326/41
[58] Field of Search ...................... 326/37–41, 47

[56] References Cited

U.S. PATENT DOCUMENTS

| | | | |
|---|---|---|---|
| 5,091,661 | 2/1992 | Chiang . | |
| 5,153,462 | 10/1992 | Agrawal et al. | 326/41 |
| 5,220,214 | 6/1993 | Pedersen | 326/41 |
| 5,231,312 | 7/1993 | Gongwer et al. | 326/41 |
| 5,386,155 | 1/1995 | Steele et al. | 326/37 |
| 5,523,706 | 6/1996 | Kiani et al. | 326/41 |

*Primary Examiner*—Michael Tokar
*Assistant Examiner*—Don Phu Le
*Attorney, Agent, or Firm*—Skjerven, Morrill, MacPherson, Franklin & Friel LLP

[57] ABSTRACT

A circuit connectable to a microcontroller having an address bus, a data bus, a read line and a write line include a programmable logic device (PLD) array, at least one input pin, at least two databus macrocells and a bit mask register. The input pin is connected to the PLD array and is connectable to the address bus. The databus macrocell is connected to the PLD array and to an external unit and is also connectable to the data bus, the read line and the write line. The bit mask register has at least two bits, each associated with one of the at least two macrocells. The databus can directly access the databus macrocell only if its associated bit in the bit mask register is of the correct state. In another embodiment, the write line carries an edge write signal and the databus accesses the databus macrocell on one edge of the edge write signal.

9 Claims, 6 Drawing Sheets

INDIVIDUALLY ACCESSIBLE MACROCELL

CROSS-REFERENCE TO RELATED APPLICATIONS

This application is a continuation-in-part application of Ser. No. 8/742,710 filed Nov. 1, 1996, now U.S. Pat. No. 5,834,947, issued Nov. 4, 1999.

FIELD OF THE INVENTION

The present invention relates to programmable logic devices, their macrocells and their connections to a microcontroller interface bus.

BACKGROUND OF THE INVENTION

Programmable logic devices (PLDs) perform logic functions quickly on a multiplicity of input signals. As shown in FIG. 1 to which reference is now made, an array of PLDs, labeled 12, receives input signals via input/output blocks 8. The results of the logic functions are known as "product terms" and are output from the PLD array 12 to one or more blocks 8, each of which comprises a macrocell 14 and an input/output unit 16.

Each macrocell 14 comprises an OR gate 20, a XOR gate 21, a flip-flop 22 and a multiplexer 24. The OR gate 20 performs OR operations on at least two "OR-PT" type product terms and the XOR gate 21 selectively passes or inverts the output of OR gate 20. The result is provided to the data (D) input of the flip-flop 22. Other product term signals, such as the CLOCK-PT, PRESET-PT and CLEAR-PT product terms, control the operation of flip-flop 22, where the CLOCK-PT is a clock signal, the PRESET-PT activates flip-flop 22 (providing a "1" signal on output) and CLEAR-PT deactivates flip-flop 22 (providing a "0" signal on output). The output of flip-flop 22 is a "registered" signal and can be selected by multiplexer 24 for the output signal of macrocell 14. Alternatively, multiplexer 24 can select the data input to flip-flop 22, otherwise known as a "combinatorial" signal. The registered signal might be needed to determine other product term signals and, therefore, is provided to PLD array 12 as a "register feedback" signal.

Typically, the output signal of PLD array 12 is utilized to control an external unit, such as opening or closing a switch. The output signal is therefore provided to input/output unit 16 comprised of a configurable buffer 26 and an external pin 28 to which the external unit is connected. Buffer 26 is configured by an output enable (OE) product term signal which indicates if buffer 26 is to function as an output buffer, for controlling an output signal, or as an input buffer through which to receive signals. In the latter case, the input signal is provided directly to the PLD array 12, in effect bypassing the macrocell 14.

In the programmable system devices (PSDs) of Waferscale Integration Inc. of Fremont, Calif., USA, the common assignees of the present invention, and in other devices, such as the MACH devices manufactured by American Microsystems Devices also of California or the MAX devices of Altera also of California. PLD array 12 functions in part as a peripheral device of a microcontroller 10 and, as a result, microcontroller 10 has to read from and write to the macrocells 14. The read operation should occur without affecting the output signal of the macrocell 14. For example, if PLD array 12 implements a counter, microcontroller 10 might want either to load the counter with a new value or read the current value of the counter.

However, every microcontroller 10 reads data by placing the address to read from on an address bus 30 and waiting for the peripheral to place the data 32 to be read on a data bus. Similarly, the address to be written to is placed on address bus 30 and the data to be written is placed on data bus 32. Furthermore, the signal to read or write is provided separately, as indicated by signals 34 and 36, respectively.

The address and data include N and M bits, respectively, where N is typically sixteen and M is typically eight. Thus, busses 30 and 32 are connected to N and M input/output blocks, shown as a single block 40 and 42, respectively. The input/output block for the read and write signals is labeled 44. For the address bits and the read and write signals, all of which are input signals, the corresponding buffers 26 are configured as input buffers and the address bits are provided along the input lines to the PLD array 12. PLD array 12 decodes the address bits to determine which macrocell 14 to access.

The macrocell 14 which is accessed must either provide the data stored in its flip-flop 22 out to PLD array 12 or receive data therefrom. In response, the PLD array 12 either provides the data to or receives data from a macrocell 14 connected to data bus 32.

For a write operation, the buffers 26 of the macrocell connected to data bus 32 are configured as input buffers and the data bits are passed through PLD array 12 to the accessed macrocell 14. To actually write a data bit into the flip-flop 22 of the accessed macrocell 14, PLD array 12 either sets the OR-PT signal which is clocked into flip-flop 22 by the CLOCK-PT signal or selects one or other of the PRESET-PT and CLEAR-PT signals, depending on the value (1 or 0) to be written in.

For data to be read from an accessed macrocell 14, the accessed macrocell 14 first provides the data to the PLD array 12 through the register feedback signal. The PLD array 12 then provides the data bits as the combinatorial output of the macrocells 14 connected to the data bus 32. As will be appreciated, for the data bits, the output enable (OE-PT) signal of the macrocells connected to the data bus and of the accessed macrocells changes depending on whether the read (i.e. output) or write (i.e. input) signal has been asserted.

It will be appreciated that accessing data with a PLD array requires three groups of macrocells, one group connected to the address bus, a second group of one being the macrocell being accessed and a third group connected to the data bus. Furthermore, the PLD array 12 has to route data through it twice, once from the macrocells connected to the address bus to the accessed macrocell and once from the accessed macrocell to the macrocells connected to the data bus.

It will further be appreciated that routing data and address information through PLD array 12 additionally requires that the bus signals follow standard timing. FIG. 2, to which reference is now briefly made, illustrates the timing of a single read/write cycle. The microcontroller begins by driving the address bus with an address 50, as indicated in graph A. The address is decoded, usually by an external unit (not shown) and a select signal is generated to the selected peripheral, such as PLD 12. The peripheral then waits for the next phase of the bus cycle when microcontroller asserts either the read or the write signal, as indicated in graph B.

In a read cycle, the peripheral responds by driving data bus with the required information, labeled 52, and microcontroller latches the data at a rising edge 54 of the read signal. In a write cycle, microcontroller provides data 52 and the peripheral latches data 52 at the rising edge 54 of the write pulse.

It will be appreciated that race conditions can occur between the data and the read/write signals due to violations of the bus setup and hold timing which occur since PLD 12 has delays therein. Furthermore, since the PLD 12 powers up every time it receives a signal, the fact that the address and data busses are connected to the PLD 12 will cause every change in the bus to trigger a power up/power down cycle of PLD 12. This continual cycling adds to consumes power.

Still further, routing the address and data bus data through the macrocells utilizes the critical PRESET, CLEAR, CLOCK and OR product terms, making it hard to implement the remaining logic functions which the PLD array must perform, not to mention the time required to develop the logic functions which respond to the address and data bus signals.

SUMMARY OF THE PRESENT INVENTION

It is an object of the present invention to provide an improved PLD circuit.

There is therefore provided, in accordance with a preferred embodiment of the present invention, a PLD based circuit connectable to a microcontroller which has an address bus, a data bus, a read line and a write line. The circuit includes the PLD array, at least one input pin connected to the PLD array and connectable to the address bus, at least two databus macrocells and a bit mask register. Each databus macrocell is connected to the PLD array and to an external unit and is connectable to the data bus, the read line and the write line. The databus macrocell can be directly accessed by the data bus. The bit mask register has at least two bits, each associated with one of the macrocells, for selecting which macrocell the databus does directly access.

There is also provided, in accordance with a further preferred embodiment of the present invention, a PLD based circuit connectable to a microcontroller. The circuit includes the PLD array, at least one input pin connected directly to the PLD array and connectable to the address bus, at least one macrocell connected to the PLD array with its corresponding input/output pin, at least two databus macrocells and the bit mask register. The databus macrocell is connected to the PLD array and has one input/output pin, two input pins and one output pin associated therewith. The input/output pin is connectable to said data bus, the input pins are connectable to the read and write lines and the output pin is connected to the external world.

Additionally, in accordance with a preferred embodiment of the present invention, the databus macrocell includes a data-in flip-flop, an output buffer, a data line, a read unit and a write unit. The data-in flip-flop has at least a data-in input port and an output port for storing a data bit therein. The output buffer is connected to the output port of the data-in flip-flop. The data line is connectable to the data bus and is connected to the data-in input port and the output buffer. The read unit is connected to a select line active when the databus macrocell is addressed by the microcontroller and is connected to the read line. The read unit activates the output buffer to provide the data bit to the data bus. The write unit is connected to the select line and the write line and activates the data-in flip-flop to store a data bit provided on the data bus.

Finally, in accordance with a preferred embodiment of the present invention, the write line carries an edge write signal and the databus accesses the databus macrocell on one edge of the edge write signal.

BRIEF DESCRIPTION OF THE DRAWINGS

The present invention will be understood and appreciated more fully from the following detailed description taken in conjunction with the drawings in which.

DETAILED DESCRIPTION OF A PREFERRED EMBODIMENT

Figure 1:
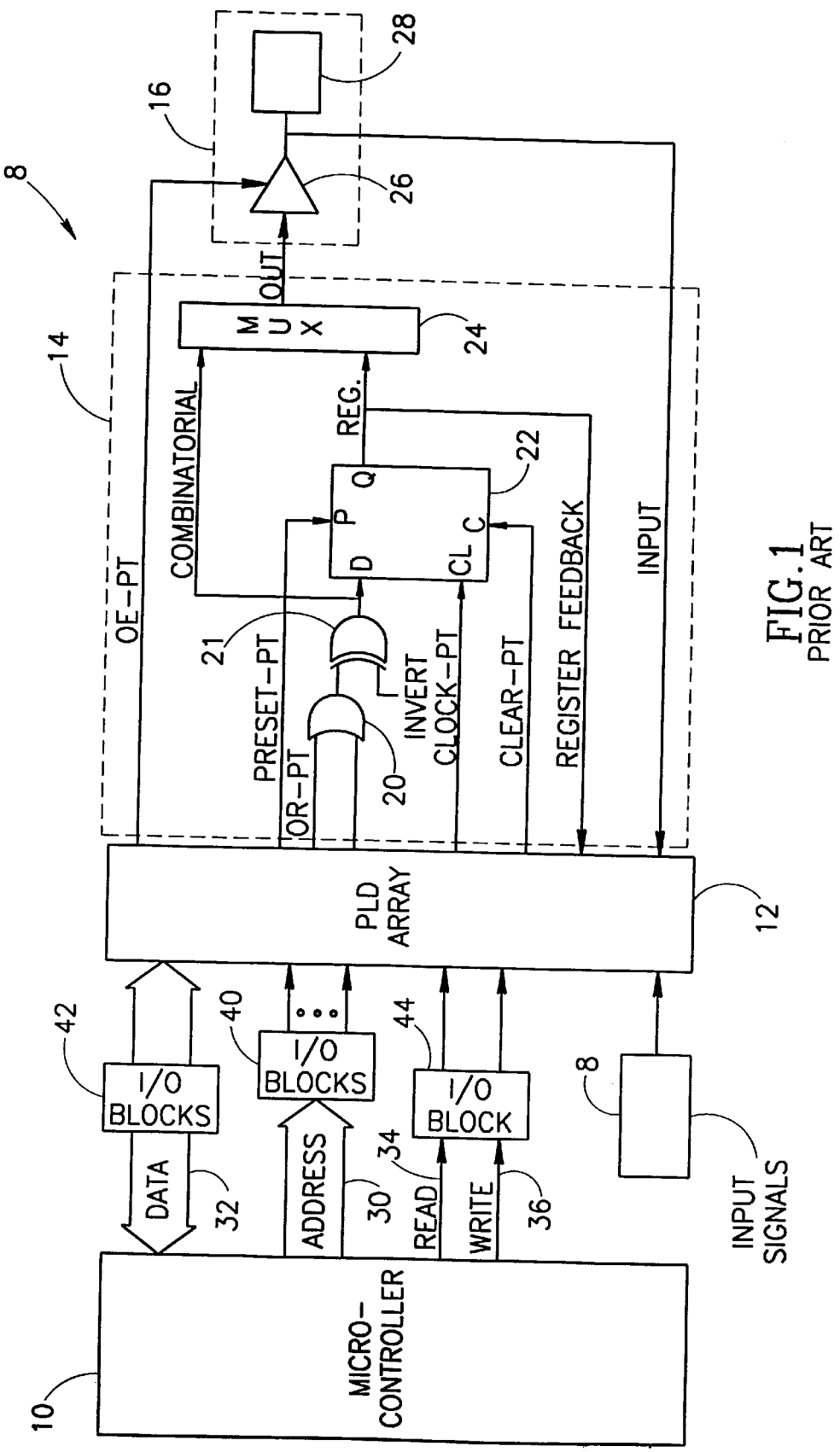
FIG. 1 is a circuit diagram illustration of a prior art PLD and macrocell array communicating with a microcontroller via data and address busses.
Figure 3:
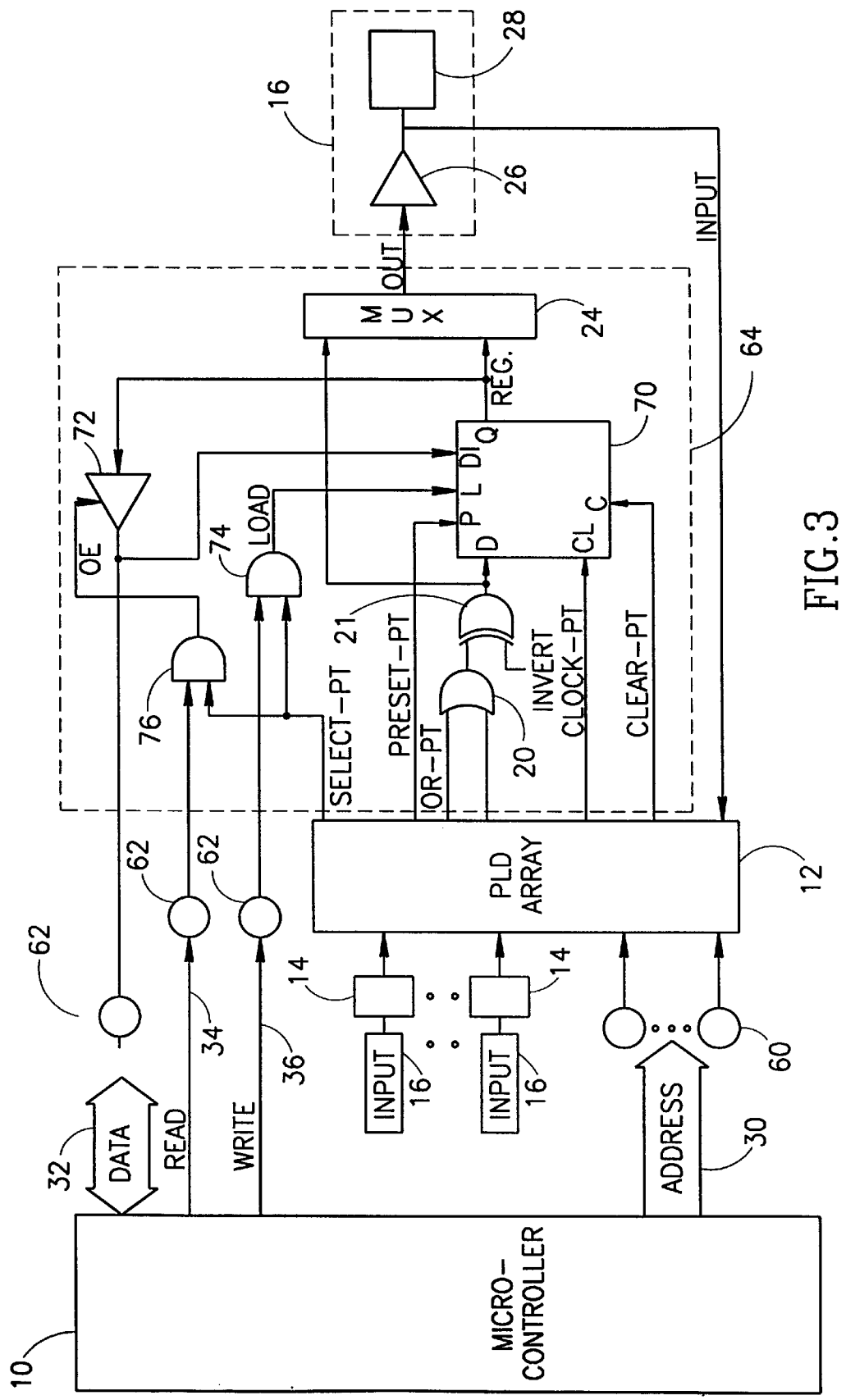
FIG. 3 is a circuit diagram illustration of a PLD and macrocell array communicating with a microcontroller via data and address busses, constructed and operative in accordance with a preferred embodiment of the present invention.

Reference is now made to FIG. 3 which illustrates a programmable logic device (PLD) and macrocell array providing direct access between the macrocell and the data bus and between the address bus and the PLD array for the purpose of reading from and writing to specific macrocells. Elements of FIG. 3 which are similar to those of FIG. 1 carry similar reference numerals.

As in the prior art, PLD array 12 communicates with the external world indirectly (i.e. through macrocells 14 and input/output units 16). In addition, in accordance with a preferred embodiment of the present invention, the address bus 30 is directly connected to PLD array 12 (rather than through a macrocell) and the data bus 32 directly communicates with the macrocell storing data of interest. This significantly reduces the number of macrocells which are dedicated for interaction with the address and data busses.

Specifically, address bus 30 is connected directly to N pins 60 (shown as a single block for clarity), where N is the number of bits in each address, and pins 60 are directly connected to PLD array 12, rather than being connected through a macrocell. Furthermore, data bus 32 and read and write lines 34 and 36, respectively, are directly connected to a plurality of databus macrocells 64 (only one shown) each of which stores the data of interest.

It will be appreciated that communication through PLD array 12, in the present invention, utilizes PLD array 12 once, to decode the address bits which address bus 30 provides directly to it and, from the decoding, to activate a SELECT-PT signal of the relevant databus macrocell 64 whose data is to be accessed.

Databus macrocell 64 comprises OR gate 20, XOR gate 21 and multiplexer 24, as in the prior art, a data-in flip-flop 70, input/output buffer 72, and AND gates 74 and 76. Data-in flip-flop 70 has the standard output Q and the standard inputs: CK to which the CLOCK-PT signal is connected, C to which the CLEAR-PT signal is connected, D to which the output of OR gates 20 is connected and P to which the PRESET-PT signal is connected. In addition, in accordance with a preferred embodiment of the present invention, data-in flip-flop 70 has two inputs, load (L) and data-in (DI). The load input indicates to data-in flip-flop 70 to load the value provided at the data-in input.

The load input is connected to the output of AND gate 74 which receives the SELECT-PT line (generated by PLD array 12 in response to an address on address bus 30) and the write line 36. Thus, the LOAD signal is activated when microcontroller 10 activates the write line 36 and selects the current databus macrocell 64. The data-in input is connected to the pin 62 which is connected data bus 32. Thus, when the LOAD signal is activated, it causes data-in flip-flop 70 to load the relevant data bit from data bus 30.

AND gate 76 receives read line 34 and the SELECT-PT line and produces an output enable (OE) signal which is provided to buffer 72. Thus, when the SELECT-PT is active (because the current databus macrocell 64 has been selected) and read line 34 is activated, buffer 72 will be an output buffer. Since buffer 72 is connected, on input, to the output signal of data-in flip-flop 70 and, on output, to the pin 62 which is connected to data bus 32, when activated, buffer 72 provides the output signal of data-in flip-flop 70 to microcontroller 10. Otherwise, buffer 72 will be inactive.

It will be appreciated that databus macrocell 64 enables microcontroller 10 to directly access the information of data-in flip-flop 70. Thus, the timing of the response to the address signal (i.e. placing the data on data bus 30) can be more accurately controlled.

Figure 4:
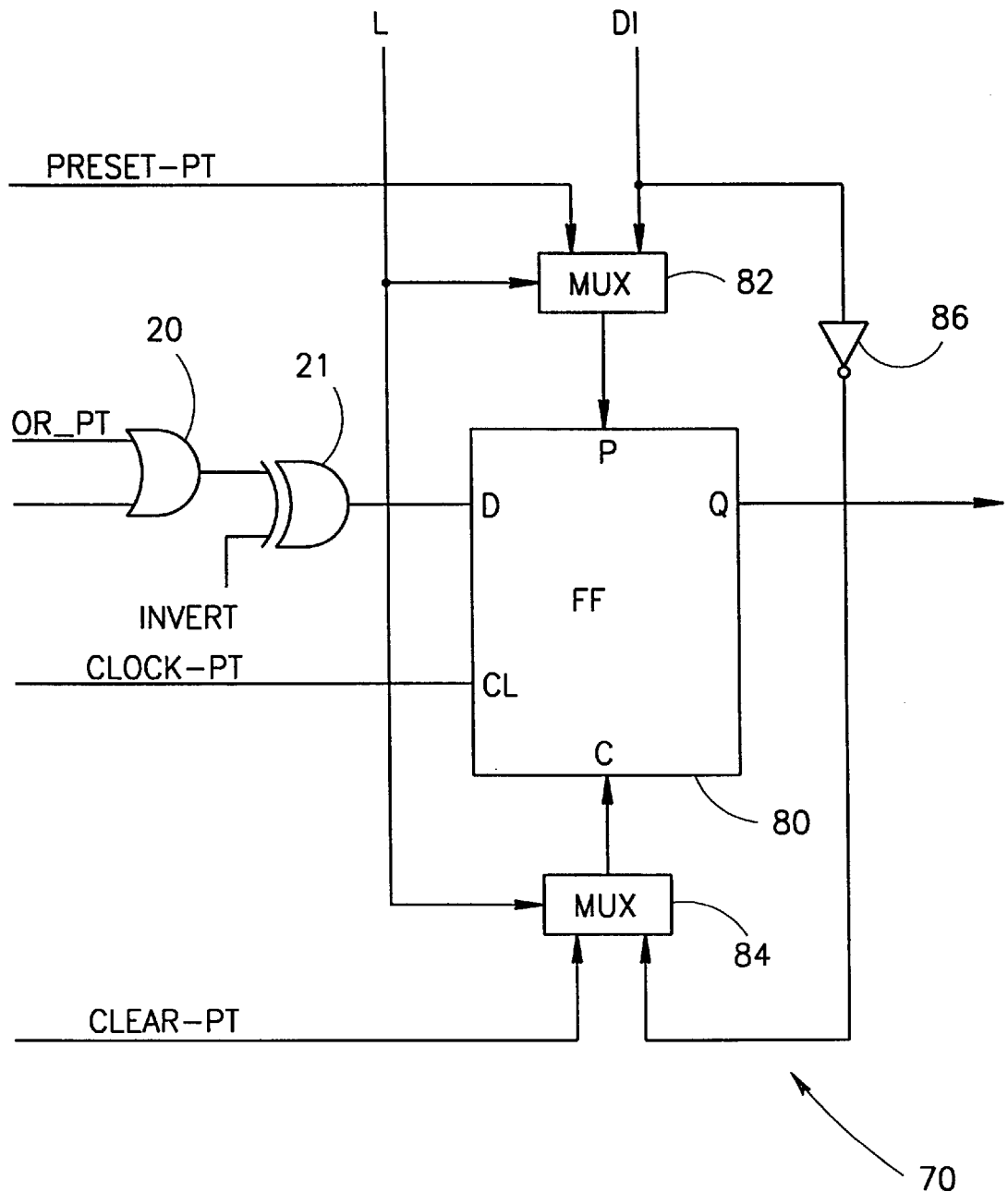
FIG. 4 is a circuit diagram illustration of a data-in flip-flop useful in the circuit of FIG. 3.

FIG. 4, to which reference is now briefly made, illustrates the elements of data-in flip-flop 70. Flip-flop 70 comprises a standard D-flip-flop 80, two multiplexers 82 and 84 and an inverter 86. D-flip-flop 80 receives the output of OR gates 20 at its D input and the CLOCK-PT signal at its CK input. As for all flip-flops, the output is provided at the Q output port.

Multiplexer 82 is connected to the preset (P) input of D-flip-flop 80 and multiplexer 84 is connected to the clear (C) input of D-flip-flop 80. Multiplexer 82 receives the PRESET-PT signal and DI signal (i.e. the data bus signal) and selects between them in accordance with the LOAD signal. Multiplexer 84 receives the CLEAR-PT and the inverse of the DI signal, provided by inverter 86, and selects between them in accordance with the LOAD signal. Thus, when the LOAD signal is not active, multiplexer 82 provides the PRESET-PT signal and multiplexer 84 provides the CLEAR-PT signal to D-flip-flop 80. However, when the LOAD signal is active, multiplexers 82 and 84 provide the data bus signal and its inverse to the preset and clear inputs, respectively.

Figure 5:
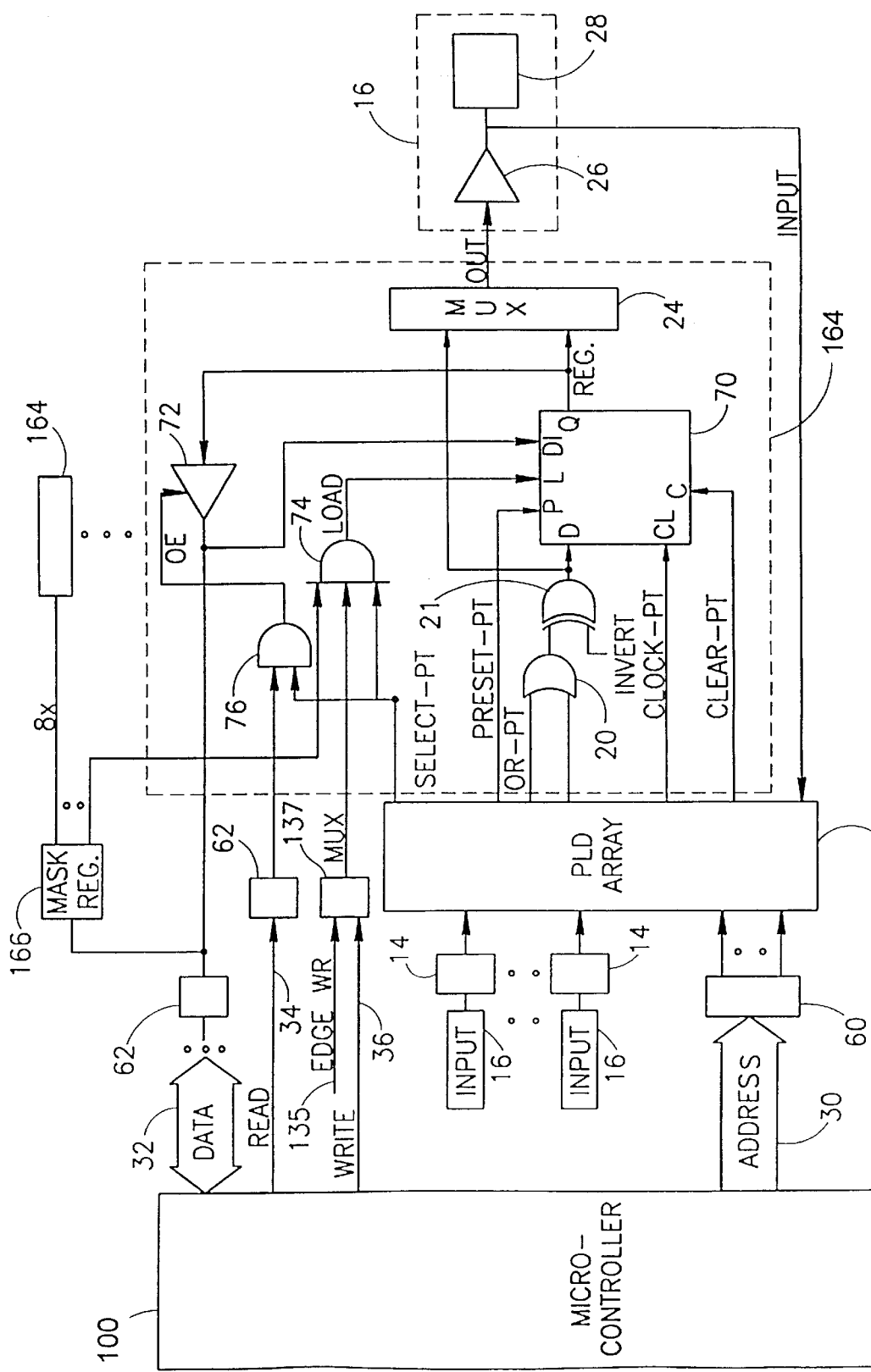
FIG. 5 is a circuit diagram illustration of a PLD and macrocell array communicating with a microcontroller via data and address busses, constructed and operative in accordance with a second preferred embodiment of the present invention.

FIG. 5, to which reference is now briefly made, illustrates an alternate embodiment of the programmable logic device (PLD) and the macrocell array described in FIG. 3. Elements of FIGS. 5 that are similar to those of FIG. 3 carry similar reference numerals. The PLD and macrocell array illustrated in FIG. 5 comprise the same elements as the PLD and macrocell array of FIG. 3 with the addition of an edge write line 138 and an 8-bit mask register 166.

A microcontroller 100 communicates with a plurality of data macrocells 164 (only one of which is shown in detail) via data bus 32, read line 34, write line 36, an edge write line 135 and a bit mask register 166. The functions of data bus 32, read line 34 and write line 36 are described hereinabove and function similarly here. The functions of edge write line 135 and bit mask register 166 will be described hereinbelow.

The data bus 32 of FIG. 3 is a standard X bit data bus which writes to X macrocells 164 at one time. Hence, in the previous embodiment, if data bus 32 is a standard 8 bit data bus, then the data bus 32 writes to 8 macrocells at one time. To enable the microcontroller 100 to selectively write to one or more macrocells 164, the present embodiment includes bit mask register 166.

In FIG. 5, microcontroller 100 can write to mask register 166 via data bus 32. The data written into mask register 166 defines which of the macrocells 164 connected to mask register 166 are to be written into. The output of each bit in mask register 166 is connected to the AND 74 of its associated macrocell 164, along with the SELECT-PT and WRITE signals as before. Since AND 74 defines the LOAD signal into the flip-flop 70, the state of the relevant bit will affect whether or not the LOAD signal is activated.

In accordance with a preferred embodiment of the present invention, the WRITE signal 36 from the microcontroller 100 is multiplexed with an EDGE WR signal 135 in a multiplexer (MUX) 137 and the output of MUX 137 is provided to AND 74.

Figure 2:
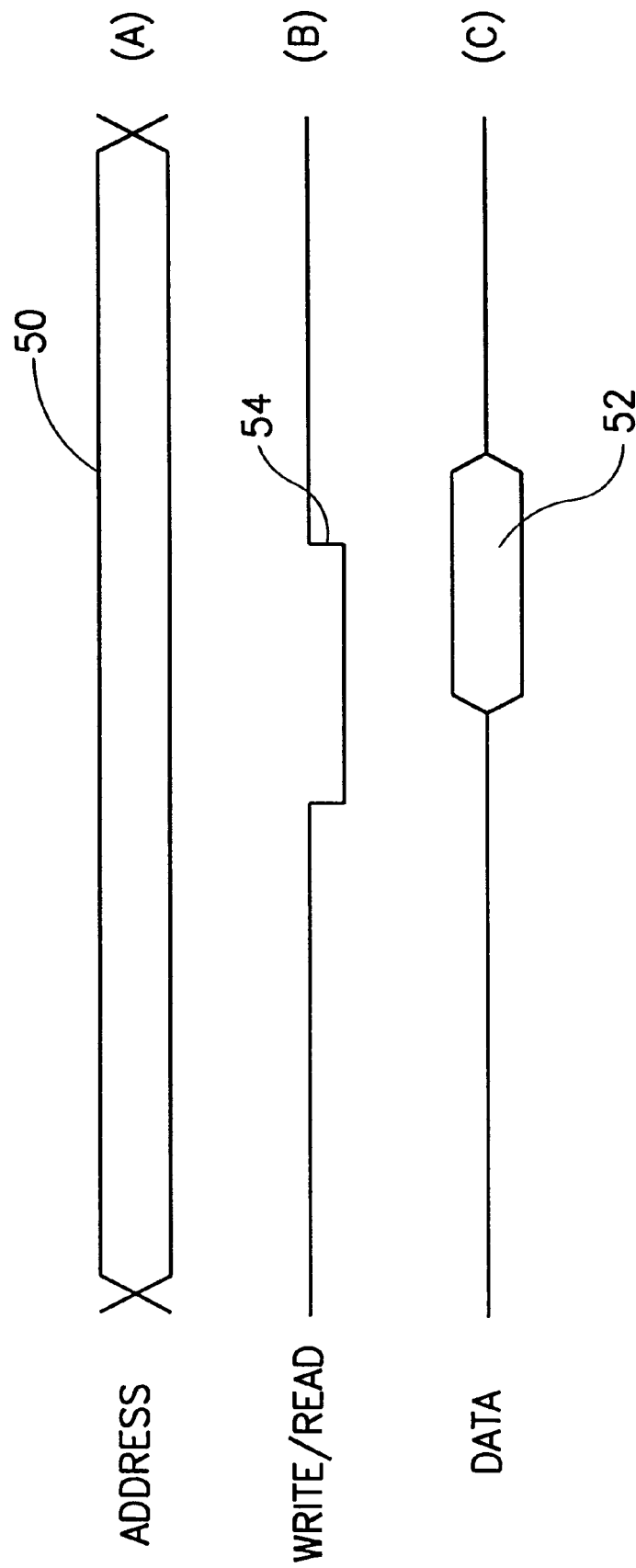
FIG. 2 is a timing diagram of a prior art data read/write cycle.
Figure 6:
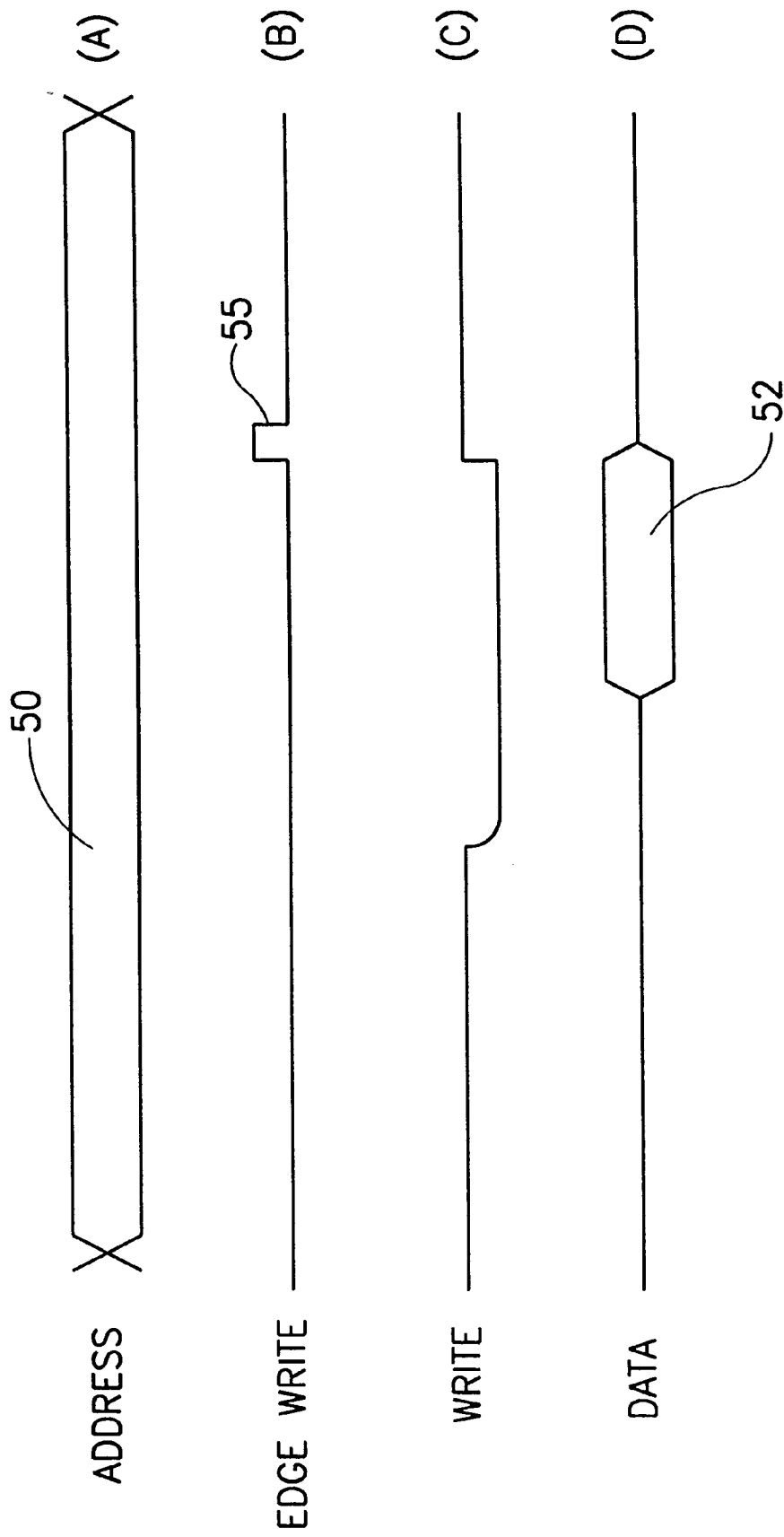
FIG. 6 is a timing diagram of a data write cycle for the embodiment of FIG. 5.

FIG. 6, to which reference is now briefly made, illustrates the timing of a single write cycle in the present invention. The microcontroller 100 begins by driving the address bus with an address 50, as indicated in graph A and as described hereinabove for FIG. 2. The macrocell then waits for the next phase of the bus cycle when the microcontroller 100 asserts the WRITE signal, as indicated in graph C, and provides the data signal. The EDGE__WR pulse is generated by the device, such as a programmable system device (PSD) of which the PLD and macrocells are a part. The EDGE__WR pulse is triggered by the trailing edge of the WRITE signal from the microcontroller 100.

If so selected in MUX 137, the LOAD signal will be activated only on the falling edge 55 of the EDGE WR pulse. Otherwise, the LOAD signal will be activated as soon as the WRITE signal is asserted.

It will be appreciated by persons skilled in the art that the present invention is not limited to what has been particularly shown and described hereinabove. Rather the scope of the present invention is defined only by the claims which follow:

We claim:

1. A circuit connectable to a microcontroller having an address bus, a data bus, a read line and a write line, the circuit comprising:

a programmable logic device (PLD) array;

at least one input pin connected to said PLD array and connectable to said address bus;

at least two databus macrocells, connected to said PLD array and to an external unit and connectable to said data bus, said read line and said write line, which said databus can directly access; and a bit mask register having at least two bits, each associated with one of said at least two macrocells, for selecting which of said macrocells said databus does directly access.

2. A circuit according to claim 1 and wherein said databus macrocell comprises:

a data-in flip-flop having at least a data-in input port and an output port for storing a data bit therein;

an output buffer connected to said output port of said data-in flip-flop;

a data line connectable to said data bus and connected to said data-in input port and to said output buffer;

read means connected to a select line active when said databus macrocell is addressed by said microcontroller and connected to said read line for activating said output buffer to provide said data bit to said data bus; and write means connected to said select line and said write line for activating said data-in flip-flop to store a data bit provided on said data bus.

3. A circuit connectable to a microcontroller having an address bus, a data bus, a read line and a write line, the circuit comprising:

a programmable logic device (PLD) array;

at least one input pin connected directly to said PLD array and connectable to said address bus;

at least one macrocell connected to said PLD array which has one input/output pin associated therewith;

at least two databus macrocells connected to said PLD array which have one input/output pin, two input pins and one output pin associated therewith; and a bit mask register having at least two bits, each associated with one of said at least two macrocells, for selecting which of said macrocells said databus directly accesses, wherein:

said input/output pin is connectable to said data bus;

said input pins are connectable to said read line and said write line; and said output pin is connectable to the external world.

4. A circuit according to claim 3 and wherein said databus macrocell comprises:

a data-in flip-flop having at least a data-in input port and an output port for storing a data bit therein;

an output buffer connected to said output port of said data-in flip-flop;

a data line connectable to said data bus and connected to said data-in input port and to said output buffer;

read means connected to a select line active when said databus macrocell is addressed by said microcontroller and connected to said read line for activating said output buffer to provide said data bit to said data bus; and write means connected to said select line and said write line for activating said data-in flip-flop to store a data bit provided on said data bus.

5. A circuit connectable to a microcontroller having an address bus, a data bus, a read line and a write line, the circuit comprising:

a programmable logic device (PLD) array;

at least one input pin connected to said PLD array and connectable to said address bus; and at least one databus macrocell, connected to said PLD array and to an external unit and connectable to said data bus, said read line and said write line, which said databus can directly access, wherein said write line carries an edge write signal and said databus accesses said databus macrocell on one edge of said edge write signal.

6. A circuit according to claim 5 and wherein said databus macrocell comprises:

a data-in flip-flop having at least a data-in input port and an output port for storing a data bit therein;

an output buffer connected to said output port of said data-in flip-flop;

a data line connectable to said data bus and connected to said data-in input port and to said output buffer;

read means connected to a select line active when said databus macrocell is addressed by said microcontroller and connected to said read line for activating said output buffer to provide said data bit to said data bus; and write means connected to said select line and said write line for activating said data-in flip-flop to store a data bit provided on said data bus.

7. A circuit connectable to a microcontroller having an address bus, a data bus, a read line and a write line, the circuit comprising:

a programmable logic device (PLD) array;

at least one input pin connected directly to said PLD array and connectable to said address bus;

at least one macrocell connected to said PLD array which has one input/output pin associated therewith;

at least one databus macrocell connected to said PLD array which have one input/output pin, two input pins and one output pin associated therewith; and wherein:

said write line carries an edge write signal and said databus accesses said databus macrocell on one edge of said edge write signal.

said input/output pin is connectable to said data bus;

said input pins are connectable to said read line and said write line; and said output pin is connectable to the external world.

8. A circuit according to claim 7 and wherein said databus macrocell comprises:

a data-in flip-flop having at least a data-in input port and an output port for storing a data bit therein;

an output buffer connected to said output port of said data-in flip-flop;

a data line connectable to said data bus and connected to said data-in input port and to said output buffer;

read means connected to a select line active when said databus macrocell is addressed by said microcontroller and connected to said read line for activating said output buffer to provide said data bit to said data bus; and write means connected to said select line and said write line for activating said data-in flip-flop to store a data bit provided on said data bus.

9. A databus macrocell connectable to a PLD array and to a data bus, the macrocell comprising:

a data-in flip-flop having at least a data-in input port and an output port for storing a data bit therein;

an output buffer connected to said output port of said data-in flip-flop;

a data line connectable to said data bus and connected to said data-in input port and to said output buffer;

read means connected to a select line of said PLD array and connected to a read line for activating said output buffer to provide said data bit to said data bus; and write means connected to said select line and a write line for activating said data-in flip-flop to store a data bit provided on said data bus.

* * * * *